(12) United States Patent
Hu et al.

(10) Patent No.: US 9,983,285 B2
(45) Date of Patent: May 29, 2018

(54) HIGH SPATIAL AND TEMPORAL RESOLUTION DYNAMIC CONTRAST-ENHANCED MAGNETIC RESONANCE IMAGING

(71) Applicant: THE REGENTS OF THE UNIVERSITY OF CALIFORNIA, Oakland, CA (US)

(72) Inventors: Peng Hu, Los Angeles, CA (US); Stanislas Rapacchi, Los Angeles, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 441 days.

(21) Appl. No.: 14/709,089

(22) Filed: May 11, 2015

(65) Prior Publication Data
US 2015/0346303 A1 Dec. 3, 2015

Related U.S. Application Data

(63) Continuation of application No. PCT/US2013/069466, filed on Nov. 11, 2013.

(60) Provisional application No. 61/725,016, filed on Nov. 11, 2012.

(51) Int. Cl.
| | |
|---|---|
| *G01R 33/563* | (2006.01) |
| *G01R 33/56* | (2006.01) |
| *G01R 33/48* | (2006.01) |
| *G01R 33/561* | (2006.01) |
| *G06T 11/00* | (2006.01) |

(52) U.S. Cl.
CPC ..... *G01R 33/5601* (2013.01); *G01R 33/4822* (2013.01); *G01R 33/5611* (2013.01); *G01R 33/5635* (2013.01); *G06T 11/006* (2013.01); *G06T 2207/10096* (2013.01)

(58) Field of Classification Search
None
See application file for complete search history.

(56) References Cited

U.S. PATENT DOCUMENTS

| | | |
|---|---|---|
| 2010/0201363 A1 | 8/2010 | Griswold et al. |
| 2011/0080166 A1* | 4/2011 | Edelman ............ G01R 33/5607 324/309 |

OTHER PUBLICATIONS

Goldstein et al., "The Split Bregman Method for L1-Regularized Problems," Apr. 1, 2009, Siam J. Imaging Sciences, vol. 2, No. 2, pp. 323-343.*

(Continued)

*Primary Examiner* — Tse Chen
*Assistant Examiner* — Nate S Sunwoo
(74) *Attorney, Agent, or Firm* — Quarles & Brady LLP

(57) ABSTRACT

A method for high spatial and temporal resolution dynamic contrast enhanced magnetic resonance imaging using a random subsampled Cartesian k-space using a Poisson-disk random pattern acquisition strategy and a compressed sensing reconstruction algorithm incorporating magnitude image subtraction is presented. One reconstruction uses a split-Bregman minimization of the sum of the L1 norm of the pixel-wise magnitude difference between two successive temporal frames, a fidelity term and a total variation (TV) sparsity term.

13 Claims, 3 Drawing Sheets

(56) References Cited

OTHER PUBLICATIONS

Korean Intellectual Property Office (KIPO), International Search Report and Written Opinion, PCT/US2013/069466, dated Feb. 28, 2014, pp. 1-11, with claims searched, pp. 12-16, counterpart to U.S. Appl. No. 14/709,089 herein.

Karl K. Vigen et al. "Undersampled Projection-Reconstruction Imaging for 1-20 Time-Resolved Contrast-Enhanced Imaging". Magnetic Resonance in Medicine. Wisconsin: University of Wisconsin, Feb. 2000, vol. 43, No. 2, pp. 170-176.

Simon Setzer. "Operator Sp l itt i ngs, Bregman Methods and Frame Shrinkage in Image Processing". International Journal of Computer Vision. May 2011, vol. 92, No. 3, pp. 265-280, ISSN 1573-1405.

Michael Lustig et al. "Sparse MRI: The Application of Compressed Sensing for for Rapid MR Imaging", Magnetic Resonance in Medicine. Wisconsin: University of Wisconsin, Dec. 2007, vol. 58. No. 6, pp. 1182-1195.

\* cited by examiner

Main Variables definitions
 Ku, Kv: k-space data for images u, v
 bdTVu, bdTVv, bdMsub: Bregman distances
  for Total Variation of images u, v
  and for their magnitude subtraction $|v| - |u|$
 $M_U$, $M_V$: initial sampling masks for $Ku_0$, $Kv_0$,
 $\lambda, \mu, v$: weighting parameters init
 ---- Generate the iteration kernel ----
 Keru ← $M_U + \lambda * Kernel_{TV} + \mu + v$
 Kerv ← $M_V + \lambda * Kernel_{TV} + \mu + v$
 ----Initiate images with sampled data ---
 Ku ← $Ku_0$
 Kv ← $Kv_0$
 u ← rku ← $F^{-1}(Ku)$
 v ← rkv ← $F^{-1}(Kv)$
with: bx ← BregUpdateLN (x, bx, thresh)
 dx ← Shrink($||bx + x||_N$, thresh)
 bx ← bx + dx - x for(i = 1: $N_{iter}$)
 ----Compute Cost Function ----
 U ← rku + $\lambda * bdTVu + \mu * (|v| - bdMsub)e^{i\Phi u} + v * u$
 V ← rku + $\lambda * bdTVv + \mu * (|v| - bdMsub)e^{i\Phi v} + v * v$ ----Compensate Swelling and TV effects ---
 u ← $F^{-1}(F(U)/ F(Keru))$
 v ← $F^{-1}(F(V)/ F(Kerv))$ ----Update Bregman distances----
 bdTVu ← BregUpdateL1(TV(u), bdTVu, threshTV)
 bdTVv ← BregUpdateL1(TV(v), bdTVv, threshTV)
 bdMsub ~ BregUpdateL1($|v|-|u|$, bdMsub, threshL1)

----Update Fidelity term without shrinking---
 rku ← $F^{-1}$(BregUpdateL2($KU_0 - M_u * F(u)$, Ku, $+\infty$ ))
 rkv ← $F^{-1}$(BregUpdateL2($Kv_0 - M_V * F(v)$, Kv, $+\infty$ ))

FIG. 2B

HIGH SPATIAL AND TEMPORAL RESOLUTION DYNAMIC CONTRAST-ENHANCED MAGNETIC RESONANCE IMAGING

CROSS-REFERENCE TO RELATED APPLICATIONS

This application is a 35 U.S.C. § 111(a) continuation of PCT international application number PCT/US2013/069466 filed on Nov. 11, 2013, incorporated herein by reference in its entirety, which claims priority to, and the benefit of, U.S. provisional patent application Ser. No. 61/725,016 filed on Nov. 11, 2012, incorporated herein by reference in its entirety. Priority is claimed to each of the foregoing applications.

The above-referenced PCT international application was published as PCT International Publication No. WO 2014/075005 on May 15, 2014, which publication is incorporated herein by reference in its entirety.

STATEMENT REGARDING FEDERALLY SPONSORED RESEARCH OR DEVELOPMENT

This invention was made with Government support under HL113427, awarded by the National Institutes of Health. The Government has certain rights in the invention.

INCORPORATION-BY-REFERENCE OF COMPUTER PROGRAM APPENDIX

Not Applicable

BACKGROUND OF THE INVENTION

1. Field of the Invention

This invention pertains generally to magnetic resonance imaging, and more particularly to high spatial and temporal resolution dynamic contrast-enhanced magnetic resonance angiography or imaging using compressed sensing with magnitude image subtraction.

2. Description of Related Art

High-resolution 3D contrast-enhanced magnetic resonance angiography (CE-MRA) has emerged as a widely accepted and powerful technique for the diagnostic assessment of almost all vascular networks. Its non-invasive nature, lack of ionizing radiation and the safety of gadolinium-based contrast agents make CE-MRA an appealing alternative to digital subtraction angiography (DSA) and computed tomography angiography (CTA). Furthermore, dynamic (time-resolved) CE-MRA provides simplified scanning logistics and improved evaluation of the hemodynamic consequences of complex vascular anatomy and pathologies while avoiding some of the limitations of traditional single-phase CE-MRA, such as incorrect contrast bolus timing and venous contamination.

Dynamic CE-MRI is also used for qualitative and quantitative assessment of tissue perfusion in various oncological applications. However, due to limitations in image acquisition speed, it is difficult to achieve high temporal and spatial resolution at the same time. As a result, typical dynamic CE-MRA acquisitions have lower spatial resolution than found with conventional CE-MRA.

The conventional clinical set-up allows the acquisition of a chest CE-MRA with $1.1 \times 0.9 \times 1.2$ mm$^3$ spatial resolution within a 24 second breath-hold. However, the 24 sec temporal resolution does not provide adequate speed for capturing the hemodynamics of a rapidly changing vascular bed. Therefore, high resolution CE-MRA is normally preceded by a separate dynamic CE-MRA sequence such as (TWIST) using a very small contrast bolus. To obtain an apparent temporal window less than 5 sec, the sequence sacrifices through-plane spatial resolution ($1 \times 1 \times 6$ mm$^3$) and uses a view-sharing technique whereby the k-space center is updated more frequently than the periphery and in turn the under-sampled periphery is shared among neighboring frames. As a result, the temporal footprint of each image frame, which is approximately 10 seconds, results in temporal blurring of rapidly changing events.

Accordingly, there is a need for a dynamic CE-MRA acquisition and image reconstruction strategy that can provide a true temporal resolution higher than TWIST and can acquire high spatial resolution CE-MRA in a shorter time window than is currently possible. The present invention satisfies that need as well as others and is generally an advancement in the art.

BRIEF SUMMARY OF THE INVENTION

The goal of the present invention is to accelerate contrast-enhanced magnetic resonance angiography (CE-MRA) to perform both high temporal and high spatial resolution dynamic CE-MRA. Acceleration is achieved by highly subsampling the acquisition and a dedicated image reconstruction algorithm using a magnitude subtraction based compressed sensing algorithm. The magnitude subtraction Compressed Sensing (CS) technique includes the magnitude subtraction of two or more temporal frames of a time series of 3D MRA volumes within the reconstruction algorithm to benefit from the enhanced sparsity of the subtracted volume while avoiding many of the drawbacks of existing k-space based complex subtraction methods. The technique enables a higher acceleration (10×) than previously accessible with conventional approaches with improved reconstructed image quality. The reconstruction is also very fast, with volumes of images available within 10 to 15 minutes, and offers multiple extensions possible in combination with parallel imaging or view-sharing techniques.

One embodiment the invention adapted for clinical use of contrast-enhanced MRI, begins with a time-bolus issued by intra-venous injection. A series of multiple volumes are then acquired continuously for few seconds (10 s to 35 s) to monitor the contrast agent evolution in the circulatory system. Preferably the arrival of the contrast in the region of interest is timed with the acquisition of a second volume so that the first volume corresponds to a non-contrast enhanced mask that can be subtracted later from the other enhanced volumes.

In one embodiment, the reconstruction is accomplished in 2 steps. The first step is a simple reconstruction using only parallel imaging that quickly provides a poor quality image for timing assessment. The second step is a second reconstruction using the CS algorithm of the invention to provide high quality images a few minutes later, as the computational load can be demanding for the hardware commercially available (10-15 min on a 3 GHz dual-core station).

Currently, on the MRI system platforms of all three major vendors (Siemens, GE, Philips), there is a dynamic contrast-enhanced MRA sequence ("TWIST" on Siemens systems, "TRICKS" in GE platform) that heavily relies on view sharing to improve temporal resolution. In the Siemens example, the nominal temporal resolution is about 1.7 s. However, the temporal foot print, which is indicative of the true temporal resolution, is about 10 seconds. The invention can be used in combination with the TWIST acquisition strategy and its use with the TWIST sequence can avoid temporal foot print issues and improve image quality.

Generally, the invention is a combination of a subsampling strategy for acceleration of the acquisition and a novel Compressed Sensing reconstruction algorithm for image quality improvement. The amount of data acquired is decreased by randomly under-sampling the Cartesian k-space preferably using a variable density Poisson-disk random pattern. In the Poisson-disk distribution, each sampled point generates a disk around itself where the probability of a new sample is decreased to ensure maximum spread of the sampling over the ky-kz plane. To generate a variable density sampling, the disk radius was defined as a function of the distance to the center of k-space (kyc,kzc): $Radius_{PDisk}(ky,kz)=0.25*\sqrt{((ky-kyc)^2+(kz-kzc)^2}$.

The reconstruction technique uses a single iterative split-Bregman minimization where $I_1$ and $I_2$ are two successive temporal frames. The Compressed Sensing algorithm reconstructs volumes images ($I_1$ and $I_2$) from subsampled k-spaces ($K_1$ and $K_2$) by minimizing the cost functions:

$$I_1 = \text{argmin} \|U_1 F(I_1) - K_1\|_2^2 + \lambda TV(I_1) + \mu \||I_2|e^{i\varphi_1} - I_1\|_1$$

$$I_2 = \text{argmin} \|U_2 F(I_2) - K_2\|_2^2 + \lambda TV(I_2) + \mu \|I_2 - |I_1|e^{i\varphi_2}\|_1.$$

In each equation, the first term is a data fidelity term, the second term is the total variation of each individual volume and the third term is the L1 norm of the pixel-wise magnitude subtracted image, i.e. $\||I_2|-|I_1|\|_1 = \||I_2|e^{i\varphi_1} - I_1\|_1 = \|I_2 - |I_1|e^{i\varphi_2}\|_1$. The fidelity term compares the Fourier transform (F) of the estimated images ($I_1$ and $I_2$) to the measured samples ($K_1$ and $K_2$) using the sampling masks ($U_1$ and $U_2$). MRA images are assumed to be piece-wise smooth, thus a finite-differences transform (Total Variation, or "TV") is used as the sparsifying transform. Additionally the L1 norm of the pixel-wise magnitude difference between the two successive temporal frames, i.e. $|(|I_2|-|I_1|)|_1$, is used in the sparsity terms with an expression that matches each argument variable ($I_1$ and $I_2$). The minimization is performed using a single split-Bregman iterative approach.

The techniques of the present invention can be adapted for use in several different types of MRI imaging. The applications can encompass perfusion-MRI, MR-angiography, both using contrast agent and non-contrast agent techniques. For example, it can be used as a novel MRA option that replaces current Siemens commercial dynamic CE-MRA implementations (TWIST sequence) while reducing contrast agent dose and improving diagnostic quality. The technique can be extended to dynamic contrast-enhanced (DCE) perfusion MRI for oncological applications and non-contrast MRI/MRA.

According to one aspect of the invention, a magnetic imaging diagnostic system is provided that uses a compressed sensing technique based on magnitude image subtraction for high spatial and temporal resolution in dynamic contrast-enhanced MR angiography (CE-MRA), for example.

According to another aspect of the invention, a magnetic imaging diagnostic system and method are provided that have high spatial and temporal resolution with lower contrast needs and reduced computation costs over conventional systems.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 2B is a listing of the main variables and processes set forth in the block diagram of FIG. 2A.

DETAILED DESCRIPTION OF THE INVENTION

Figure 1:
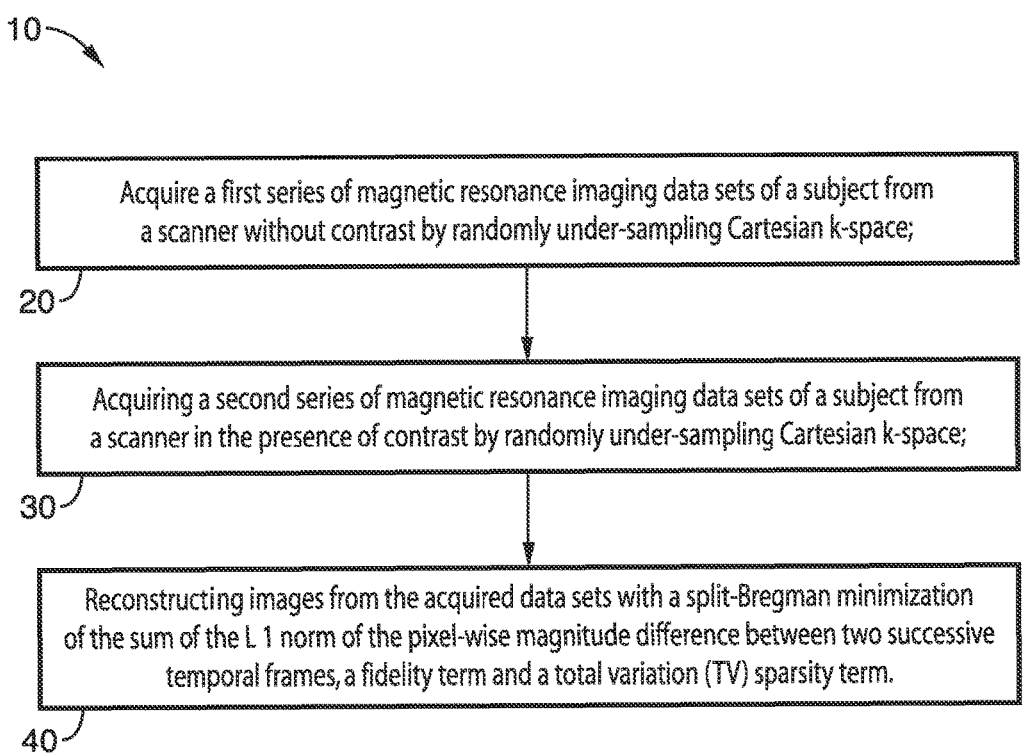
FIG. 1 is a flow diagram of one embodiment of a contrast enhanced magnetic resonance angiography (CE-MRA) method according to the invention.

Referring more specifically to the drawings, for illustrative purposes several embodiments of the methods for producing magnetic resonance imaging the present invention are depicted generally in FIG. 1 through FIG. 2B. It will be appreciated that the methods may vary as to the specific steps and sequence and the diagnostic systems may vary as to structural details, without departing from the basic concepts as disclosed herein. The method steps are merely exemplary of the order that these steps may occur. The steps may occur in any order that is desired, such that it still performs the goals of the claimed invention.

Generally, an image acquisition and reconstruction system and method is provided that can be used for dynamic CE-MRA that uses a CS algorithm with integrated magnitude subtraction to promote sparsity. In the CE-MRA illustration of the algorithm, the reconstruction of successive temporal frames is considered as a single reconstruction problem and the magnitude difference of the two successive temporal frames is used as the sparsifying transform. This approach is superior to independent CS reconstruction or direct k-space subtraction based sparsifying methods. The CS image reconstruction algorithm and the k-space under-sampling pattern and acquisition view order can also be optimized.

Turning now to FIG. 1, a flow diagram for one method 10 for magnetic resonance imaging using under-sampled Cartesian k-space and reconstruction with a Compressed Sensing (CS) algorithm for dynamic CE-MRA that integrates magnitude subtraction into the reconstruction is schematically shown. At block 20 of FIG. 1, a first series of magnetic resonance imaging data sets is acquired from a magnetic resonance imaging scanner. Various under-sampling options in the ky-kz plane are available with 3D Cartesian acquisitions. For example, the under-sampling pattern can be a radial-like uniform under-sampling in the ky-kz plane. A variable density random sampling under-sampling scheme can also be used. However, a Poisson-Disk random sampling scheme was shown to provide the best sampling scheme and is preferred.

According to Compressed Sensing theory, an image that is sparse in a given transformation domain (i.e. number of significant coefficients in the transformation domain is much smaller than total number of coefficients) can be recovered, sometimes perfectly, using a L1 norm minimization technique based on many fewer samples than specified by the Nyquist sampling limit or even parallel imaging, as long as the samples are obtained incoherently. In MRI, the incoherent sampling can be achieved by randomly skipping k-space lines. Therefore, the sparser the representation of the signal, the fewer samples that are needed to accurately reconstruct the signal.

Different strategies have been previously identified to promote the sparsity of a magnetic resonance image, including wavelet transformation, total variation (TV) transformation, and principal component analysis (PCA). For CE-MRA applications, the images may be very sparse in the image domain even without any transformation.

Once the first series of data sets are acquired at block 20, a second series of data sets can be acquired at block 30 of FIG. 1, which are acquired in the presence of contrast agents. While contrast is used in the illustration of FIG. 1, the methods can be used for imaging contexts that without contrast. The use of contrast may be optional in some settings.

Another strategy to promote sparsity uses subtraction techniques. In dynamic CE-MRA images acquired during a single breath-hold, the blood vessels remain in the same position but the signal intensity of the blood in the vessels changes drastically over time. Therefore, a subtraction of two or more successive temporal frames highlights the region of interest with changing signal intensity due to contrast arrival while suppressing regions without signal intensity change. As a result, subtraction enhances the inherent sparsity of CE-MRA images. This "subtraction sparsity" has previously been shown to benefit traditional parallel imaging reconstruction by subtracting the pre-contrast mask k-space data from the contrast-enhanced k-space before any further reconstruction and processing. However, direct k-space complex subtraction suffers from several problems such as a SNR (signal to noise ratio) penalty, phase noise sensitivity and unavailable reference images due to limits in breath-holding time and mismatch between multiple breath holds.

To avoid these problems with complex k-space subtraction while leveraging subtraction sparsity, the CS algorithm for dynamic CE-MRA integrates magnitude subtraction into the reconstruction. In the algorithm applied at block 40 of FIG. 1, the sparsity is enforced in the magnitude-subtracted images of successive temporal frames.

The algorithm that is applied at block 40 of FIG. 1 for the reconstruction using the acquired data sets uses a split-Bregman minimization of the sum of the L1 norm of the pixel-wise magnitude difference between two successive temporal frames (i.e. $|(|I_2|-|I_1|)|_1$, a fidelity term and a total variation (TV) sparsity term.

Figure 2A:
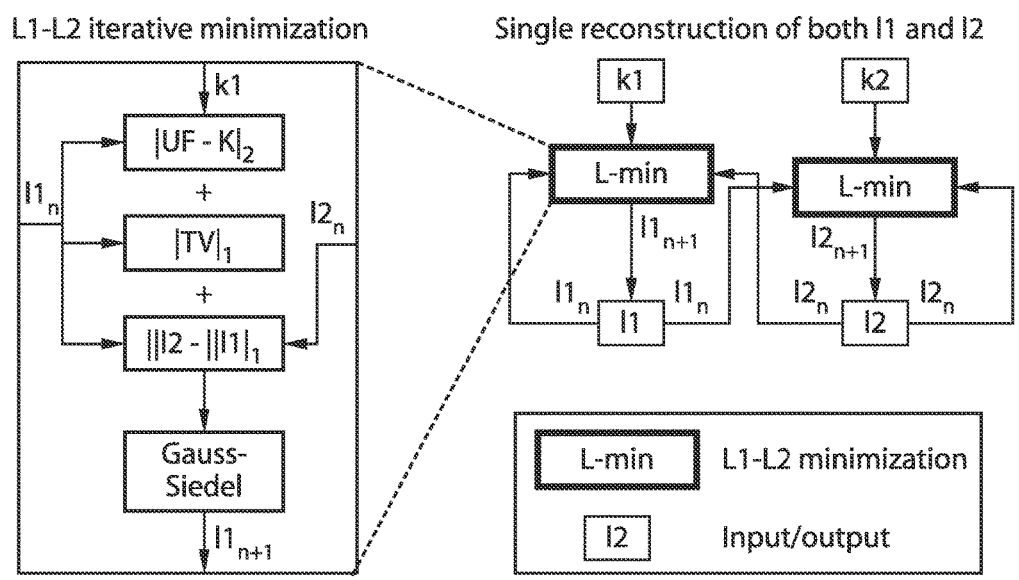
FIG. 2A is a schematic block representation of one embodiment of a magnetic resonance reconstruction compressed sensing algorithm incorporating magnitude subtraction according to the invention.

Referring also to FIG. 2A and FIG. 2B, in a dynamic CE-MRA experiment, $K_1$ is the under-sampled k-space data for temporal frame #n, and $K_2$ is the under-sampled k-space data for temporal frame #(n+1), then CS images reconstruction corresponds to the minimization of one L2-norm of the difference between estimated and measured samples (the fidelity term) and one or several L1-norm(s) of sparsity penalization(s) (the sparsity terms):

$$I_1 = \mathrm{argmin} \|U_1 F(I_1) - K_1\|_2^2 + \lambda TV(I_1);$$

$$I_2 = \mathrm{argmin} \|U_2 F(I_2) - K_2\|_2^2 + \lambda TV(I_2).$$

The fidelity term compares the Fourier transform (F) of the estimated images ($I_1$ and $I_2$) to the measured samples ($K_1$ and $K_2$) using the sampling masks ($U_1$ and $U_2$). The MRA images are assumed to be piece-wise smooth, thus a finite-differences transform (Total Variation, $TV(I_1)$) can be used which is the L1-norm of the discrete gradients of $I_1$ as the sparsifying transform. As a comparison with the strategy based on magnitude subtraction, the equation was extended by adding a L1-norm minimization of the reconstructed images after complex k-space subtraction $K_2-K_1$. For dynamic CE-MRA applications, the complex k-space subtraction CS can be formulated as:

$$I_{kd} = \mathrm{argmin} \|U_{kd} F(I_{kd}) - (K_2-K_1)\|_2^2 + \lambda TV(I_{kd}) + \mu |I_{kd}|_1;$$

where $I_{kd}$ is the unknown subtracted image. The L1-norm $|I_{kd}|_1$ promotes blood vessel enhancement and penalizes noise in the background while $TV(I_{kd})$ promotes images sparsity.

In current clinical practice of traditional CE-MRA, the pre-contrast mask image is often subtracted from the post-contrast image in magnitude only and the phase of the images is typically not used. To benefit from the "subtraction sparsity" without the aforementioned drawbacks of k-space subtraction, a magnitude subtraction is included in the reconstruction algorithm. The L1 norm of the pixel-wise magnitude difference between the two successive temporal frames, i.e. $|(|I_2|-|I_1|)|_1$, is used in the sparsity terms instead of the k-space subtracted image. In an iterative algorithm solving for both $I_1$ and $I_2$, this magnitude difference is expressed according to each argument variable to find: assuming $I_2$ fixed, the L1-norm of the magnitude difference is a function of the complex vector $I_1$: $\||I_2|-|I_1|\|_1 = \||I_2|e^{i\varphi_1} - I_1\|_1$ with $\varphi_1 = \mathrm{angle}\,(I_1)$.

Likewise: $\||I_2|-|I_1|\|_1 = \|I_2 - |I_1|e^{i\varphi_2}\|_1$. Instead of solving each minimization separately, minima $I_1$ and $I_2$ are approached iteratively in a single algorithm as shown below:

$$(I_1, I_2) = \mathrm{argmin} \begin{Bmatrix} \|U_1 F(I_1) - K_1\|_2^2 + \lambda TV(I_1) + \mu \||I_2|e^{i\phi_1} - I_1\|_1 \\ \|U_2 F(I_2) - K_2\|_2^2 + \lambda TV(I_2) + \mu \|I_2 - |I_1|e^{i\phi_2}\|_1 \end{Bmatrix}$$

The definitions of the main variables in the algorithm and routines are shown in FIG. 2B. It can be seen in FIG. 2A that the reconstructions of the 2 volumes now become interdependent and both K1 and K2 participate in the reconstruction of each volume. The joint function minimization is performed using a single split-Bregman algorithm, which is fast, stable and highly parallelizable.

The Compressed Sensing algorithm minimizes cost function for both volumes from before and after contrast injection in a single, fast iterative reconstruction. A Gauss-Seidel method is employed to approach the cost function minimum. Cost function is divided into multiple Bregman distances, which are updated according to their norm and a threshold (except for the fidelity term that has no shrinkage, thus the infinite threshold). Thresholds are defined as the median intensity of first Bregman distances after initialization (without thresholding). The Gauss-Seidel method enables the algorithm to converge towards the function minimum in a small number of iterations.

In the CS algorithm, taking advantage of the sparsity and redundant information in dimensions other than the three spatial dimensions is very important. Although the magnitude subtraction CS algorithm focuses on the time dimension, it can also be adapted to consider other dimensions such as multiple coil elements.

The extension of the reconstruction technique by combining it with parallel imaging can potentially improve the quality of reconstructed images and allow even higher acceleration rates. Either an image-based parallel imaging, like SENSE or a k-space based method, like SPIRiT, could also be considered as an enhancement to the algorithm. The Poisson-disk random distribution has the advantage of being highly compatible with k-space based parallel imaging reconstruction as the samples are spread out over the entire k-space.

Although the method is illustrated in the context of CE-MRA, it may be adaptable to other applications that benefit from acquisitions of 5-6 complete 3D volumes within a single breath-hold. The algorithm can also be applied to dynamic contrast-enhanced MRI (DCE-MRI) for perfusion imaging with minimal modification of the sequence. The high spatial and temporal resolution allowed by the method may also facilitate various model-based perfusion quantification schemes using DCE-MRI by sampling the 3D volume more frequently on the signal-time curve. The method could further benefit perfusion imaging and perfusion quantification for cardiac applications where motion is a source of artifacts and spatial resolution and coverage are limited by the duration of the acquisition of each frame. Similarly, perfusion quantification for oncology MRI could benefit from higher temporal and spatial resolution to detect small metastases. In addition to various contrast-enhanced imaging applications, the methods can potentially be applied to non-contrast MRA/MRI applications, such as dynamic arterial-spin labeling MRA, to shorten the acquisition time of these applications.

The invention may be better understood with reference to the accompanying examples, which are intended for purposes of illustration only and should not be construed in any sense as limiting the scope of the present invention as defined in the claims appended hereto.

Example 1

In order to demonstrate the invention, full-sampled Cartesian 3D CE-MRA datasets from 6 volunteers were retrospectively under-sampled and different strategies of reconstruction were evaluated (independent CS, k-space complex subtraction CS and magnitude subtraction CS). The retrospective evaluation focused on the reconstruction of a set of 2 volumes: the mask pre-contrast and the contrast-enhanced volume. However, for a clinical dynamic CE-MRA acquisition, more than two temporal frames are typically acquired.

Specifically, in vivo high-resolution thoracic CE-MRA data were acquired from 6 healthy volunteers. A Cartesian 3D spoiled gradient echo sequence was used for the MRA acquisitions. All imaging was performed on a 1.5 T Avanto MRI system (Siemens Healthcare, Erlangen, Germany) using a combination of 4 to 6 channels with a phased array surface coil (CP mode) and a spine coil. All in vivo data were imported into Matlab (MathWorks, Natick, Mass.) for offline reconstruction on a dual-core 3.07 GHz station with 24 GB RAM.

The imaging parameters included: TE/TR: 0.97/2.3 ms, Cartesian matrix size: 512×270-294×64-96, resolution: 0.98×0.98×1.3-2.2 mm$^3$, pixel bandwidth=800 Hz, flip angle=25°. The sequence was performed both pre- and post-contrast injection. The pre-contrast image was used as a mask reference image. To determine the delay time between initiation of the contrast injection and the arrival of the contrast agent in the ascending aorta, a small bolus of the contrast agent (0.02 mmol/kg of body weight, Multihance®) was injected before the pre-contrast mask reference image and a high temporal resolution TWIST sequence with view sharing was used to determine the timing of the post-contrast CE-MRA acquisition. Two contrast-enhanced data sets were acquired in order to capture both arterial and late venous phases. The three MRA data sets (one pre- and two post-contrast) were acquired in three separate breath-holds each less than 25 seconds. To facilitate retrospective comparisons, the acquired k-space was fully sampled with no parallel imaging but with partial Fourier factors of 8/10 along both ky and kz directions to finish the acquisition within a single breath-hold. Thus reference data are accelerated 1.56 times (~1.6×). The through slice spatial resolution (1.3-2.2 mm) was adjusted lower than the standard clinical CE-MRA sequence to allow completion of the partially full-sampled k-space acquisition within a single breath-hold while maintaining adequate spatial and anatomical coverage.

The k-space under-sampling pattern was also optimized. The k-space under-sampling pattern may be critical to high quality CS reconstruction. 3D Cartesian acquisitions offer various under-sampling options in the ky-kz plane such as a radial-like uniform under-sampling in the ky-kz plane, a Poisson-Disk random sampling or a variable density random sampling. Different under-sampling schemes were evaluated retrospectively on the fully sampled Cartesian data. Three random sampling schemes were evaluated with varying distributions in the ky-kz plane: a uniform distribution, a variable density distribution and a Poisson-disk distribution with variable density. For all sampling patterns, 10% of the samples were distributed in the center of k-space to fully acquire low frequency points.

In the variable density random sampling, each ky-kz sample was defined by its polar coordinates as follows: a zero-centered Gaussian-probability density function was used to generate a random radius value, with a sigma equal to: sigma=0.5*max($ky_{max}$, $kz_{max}$). And the angle was defined from a uniform random distribution. In the Poisson-disk distribution, each sampled point generates a disk around itself where the probability of a new sample is decreased to ensure maximum spread of the sampling over the ky-kz plane. To simulate a variable density sampling, the disk radius was defined as a function of the distance to the center of k-space (kyc, kzc):

$$\text{Radius}_{PDisk}(ky,kz)=0.25*\sqrt{(ky-kyc)^2+(kz-kzc)^2}$$

All proposed under-sampling patterns were applied retrospectively and image quality was compared on reconstructed images using the magnitude subtraction-based CS algorithm.

In order to optimize the algorithm, the weighting parameters in the equations were optimized by retrospectively under-sampling the k-space and minimizing the root mean square error between CS reconstructed images and the images from original k-space. Normalization of the data prior to CS reconstruction by their maximum image intensity allows the use of the same weighting parameters for a large range of MRA datasets. The optimized weighting parameters were fixed for other applications.

The optimal number of iterations for the reconstruction process was also defined for best image reconstruction within a limited time. Using an under-sampling rate of 10 (10×) to under-sample full k-space, images were reconstructed with the magnitude-subtraction CS algorithm using increasing numbers of iterations. The optimal number of iterations was defined as when the reconstruction could not improve the results further based on root mean squared error measures.

Using previously defined sampling rate and number of iterations, it was then possible to evaluate different strategies of reconstruction. The following strategies were evaluated: a) reference images from original k-space data after Margosian reconstruction followed by magnitude subtraction of the images; b) separate independent CS reconstructions without subtraction sparsity using retrospectively under-sampled data followed by magnitude subtraction of the CS reconstructed images; c) k-space complex subtraction followed by CS reconstruction of a single subtraction volume; d) the proposed magnitude subtraction CS reconstruction using both pre- and post-contrast data sets followed by magnitude subtraction of the CS reconstructed images. Only subtracted images were compared, as source images are not accessible with the k-space subtraction CS technique. Both 3D volumes and thin-slab maximum-intensity projection (MIP) were provided for quantitative and qualitative evaluation.

In addition, root mean square errors (RMSE) were quantified between the subtraction of the reconstructed volumes and the subtraction of the reference volumes from the original k-space dataset. RMSE were quantified only on the voxels with intensity in the upper 90% of the intensity scale to exclude background noise in the RMSE calculation. Values from the different volunteers were then averaged and reported for different under-sampling rates.

The quality of the images reconstructed from the different methods was graded by 2 experienced radiologists, who were blinded to the information related to subject, reconstruction method and acceleration rate. A 4-point scale (1=poor, 2=fair, 3=good, and 4=very good) was used for the grading. Images were saved as uncompressed DICOM series and presented to the evaluators on a computer workstation side by side, with the order in which they are presented randomized.

A one-way ANOVA analysis was performed on log-RMSE in order to satisfy the assumptions of ANOVA. The independence of the observers was validated using Kappa test. The kappa statistic for agreement and analysis of variance with Dunnett and Tukey multiple comparisons tests were performed using IBM SPSS Statistics 20.0 software. A 5% level of significance was used.

Example 2

Given the optimization of the CS image reconstruction algorithm and a k-space under-sampling pattern, it was possible to evaluate CS image quality in a prospective fashion.

Following the retrospective study, 2 new volunteers were obtained for imaging at 1.5 T. A custom sequence was designed and implemented to prospectively under-sample the Cartesian matrix and consequently accelerated the acquisition to obtain a time-series of high-resolution 3D volumes throughout the course of a single contrast bolus within a single breath-hold. The Poisson-disk random under-sampling was implemented with variable density as described in the retrospective study. In order to reduce image artifacts and signal interferences caused by abrupt changes in the sampled k-space locations, a spiral k-space trajectory was designed. The k-space trajectory in the ky-kz plane started from the center of k-space. Samples were sorted according to their radius and angles to generate a spiral-like pattern in this plane. This trajectory sampled the low frequency k-space at the beginning of each temporal frame, hence reducing motion sensitivity, and also limiting eddy-currents induced by large phase-encoding gradients that potentially affect imaging.

The imaging protocol for prospectively under-sampled acquisition first provided a small bolus time (0.01 mmol/kg of body weight) combined with a low resolution time-resolved TWIST CE-MRA to determine the timing of the prospectively under-sampled CE-MRA data set and to compare with the prospectively under-sampled CE-MRA.

Subsequently, a time-series of high-resolution dynamic CE-MRA using the sequence was acquired over a 35 second period using a 0.015 mmol/kg bolus of contrast (Ablavar®) at 0.165 mmol/s timed to arrive during the second frame. The net acceleration rate for the prospective study was 12.5×. The first frame was defined as a mask to be subtracted from other frames for background suppression. The subject was asked to hold his/her breath for as long as possible and then to take shallow breath until the end of the acquisition. Imaging parameters for the sequence were as follows: TE/TR: 0.97/2.3 ms, matrix size: 448×270-322×72-80, resolution: 1.12×1.12×2.0 mm$^3$, pixel bandwidth=860 Hz, flip angle=25°.

The number of slices and slice thickness were adapted to match the volunteer's thorax size while maintaining the same temporal resolution among subjects. Partial Fourier factors of 8/10 along both ky and kz were applied and a net acceleration factor including the partial Fourier factors was 12.5× using the variable density Poisson-disk scheme. This enabled a temporal resolution of 5.9 s per frame for a total of 6 volume-frames to be acquired within a single breath-hold. The same sampling pattern was applied to all frames. Images from zero-filled k-space were provided immediately on the console for bolus-timing validation. Data were then imported in Matlab for offline CS reconstruction.

For image reconstruction and evaluation of time-series CE-MRA, volume-frames were reconstructed pair-wise (volumes 1&2, 2&3, 3&4, etc.) using proposed magnitude-subtraction CS. The first reconstructed volume, without contrast present in the vessels, was subtracted to other volumes as a mask to suppress background tissues. Reconstructed images were compared to the TWIST CE-MRA images at similar time points.

Optimal parameters from the retrospective study provided a best combination of weighting parameters: $\lambda=10^{-3}$ and $\mu=10^{-5}$ to minimize error between reconstructed images and reference images. The impact of the number of iteration in the reconstruction on image quality and main vessels contrast could be seen. The split-Bregman algorithm allowed fast convergence and the reconstructed image quality and detail contrast did not improve further after 10 iterations. The resulting small number of iterations enabled a fast reconstruction of the 2 volumes within 4-6 minutes per coil on the dual-core 3.07 GHz station. In order to further compare all reconstruction algorithms on an equal basis, the number of iterations was limited to 10 regardless of the type of reconstruction.

The selected sampling strategy was also shown to be important in the resulting reconstruction image quality. Images reconstructed with the proposed magnitude-subtraction CS algorithm from data with the same under-sampling rate were compared with images produced with several other sampling strategies. For example, the uniform random sampling approach provided poor image quality and limited details of small blood vessels. The variable density Poisson-disk random sampling offers reduced reconstruction error (23% RMSE compared to 34% RMSE for uniform random sampling) even at an under-sampling rate of 8×. Small blood vessels are better delineated and contrast is improved using the variable density Poisson-disk random sampling. The variable density sampling also provides improved image quality compared to uniform density sampling. The variable density Poisson-disk random sampling was used for all subsequent experiments with 10% of the acquired samples distributed in the k-space center and partial Fourier factors of 8/10 in both ky and kz.

The impact of under-sampling rates on image quality was also evaluated. At a net acceleration rate of 8×, the image quality was highly comparable with the reference. The CS algorithm was able to provide high quality reconstruction at 10× and 12×, albeit at an increasing loss of smaller vessels which was expected.

Different image CS reconstruction strategies for a contrast-enhanced MRI dataset retrospectively under-sampled by 8-fold were also evaluated and compared. The strategy of independent reconstruction of each volume does not render all details in the reference image, especially small blood vessels, as it takes no benefit from the "subtraction sparsity" between the 2 temporal frames. This strategy resulted in the highest RMSE when compared to the reference images for all under-sampling rates. The strategy of complex k-space subtraction before CS reconstruction uses the redundancy to enforce stronger sparsity assumptions. This indeed reduced the error compared to independent CS reconstruction, although not significantly (p=0.44). However the k-space subtraction strategy suffers loss of SNR and anatomical details that corrupted the reconstructed images.

By comparison, the magnitude-subtraction CS reconstructed images with accurate details and sharp contrast despite an aggressive under-sampling rate of 8×. The cost of under-sampling could be observed as the smaller blood vessels were not reconstructed in their full length. But the contrast and delineation of the main circulation tree were accurately rendered with no obvious reconstruction artifact. This accuracy was confirmed by RMSE quantification. Magnitude-subtraction CS reconstructed images have lower RMSE than independent reconstruction CS (p=0.01) and k-space subtraction CS (p=0.07) for all under-sampling rates tested (6× to 10×). Quantified error increases almost linearly with the under-sampling rate.

Image quality was also scored. Blinded quality assessment from 2 independent reviewers showed no statistically significant disagreement (K=0.84, 95% c.i. [0.72-0.95]) between observers. Image scores varied greatly between reconstruction methods for highly under-sampled data. Reference image (REF) quality scored on average 3.80±0.59. Under-sampling k-space penalizes image quality significantly for all CS reconstruction compared to reference images from original k-space (p<0.05 for all techniques). The K-space subtraction strategy suffered very poor image quality (1±0 for all under-sampling rates) due to the noise amplification from complex subtraction. Independent CS reconstruction had a significantly lower image quality than seen with the magnitude subtraction CS (p<0.05 for 8× and 10×) method of the invention, ranking slightly below "average" (1.92±0.45 for 8×) while magnitude subtraction CS images were considered "good" for all rates (2.67±0.49 for 8×).

The time-resolved high-resolution CE-MRA technique was also shown to perform well in the in vivo applications. Both source images and subtracted images were provided using the approach. The under-sampling of k-space at a rate of 12.5× allowed the acquisition of 1 complete volume every 5.9 seconds. The CS algorithm provided sharp contrast in the blood vessels.

The temporal acquisition window of 5.9 s in the study was sufficient to resolve the pulmonary and systemic vascular phases of contrast enhancement during a single breath hold. The reconstruction of different temporal frames after subtraction of the CS-reconstructed mask volume showed the contrast agent bolus dynamics, and clearly distinguished contrast first-passage in the pulmonary and systemic circulation. In each subtracted volume, blood vessels were well delineated and had high contrast. Higher resolution resulted in good definition of small arteries and veins. The combination of multiple phases enables reconstruction of a high-resolution 3D volume of the whole circulatory system to allow for the differentiation of arterial and venous blood in various plane orientations.

Due to the highly accelerated acquisition (12.5×) achieved using the CS CE-MRA sequence, a 3-fold higher through plane resolution (2 mm vs. 6 mm) and a significantly shorter temporal footprint (5.9 s vs. ~10 s) was achieved over the TWIST sequence currently used for dynamic CE-MRA, while maintaining similar spatial coverage. The difference of spatial resolution in the slice dimension between the TWIST and the high-resolution time-resolved CE-MRA could be clearly observed.

Example 3

To further demonstrate the capabilities of the compressed sensing method, image series were acquired using the conventional TWIST view-sharing process and the CS method with parallel imaging for comparison. Evaluations of the methods were conducted on a phantom and on acquired clinical carotid TR-CE-MRA and thoracic TR-CE-MRA data sets.

The evaluation of the phantom was designed to reproduce the impact of view-sharing on time-resolved CE-MRA and to validate the reconstruction of reduced view-shared data using Compressed Sensing in the scenario of fast events in smaller vessels. A set of tubes was filled with a mixture of contrast agent (Gd-DTPA, Magnevist, Bayer) and saline. An air bubble was introduced using the clinical power-injector at 0.75 mL/s. A TWIST acquisition was performed throughout the injection to track the bubble in negative contrast, on a 3T scanner (Skyra, Siemens). The acquisition parameters are: A=5%, 5 B segments, temporal resolution=1.25 s, resolution=1.3×1.3×1.3 mm$^3$, matrix size=230×230×46, GRAPPA acceleration of 2×2 (24×24 calibration lines), partial Fourier of 6/8 and TE/TR=1.56/2.55 ms. Both TWIST (temporal footprint $T_{fprint}$=6.05) and CS-TWIST ($T_{fprint}$=2.2 s) reconstructions were performed from the same dataset.

For the clinical imaging evaluation, TWIST imaging datasets were gathered from random clinical subjects to evaluate the method on a wide range of time-resolved MRA applications. Carotid TR-CE-MRA typically involves both high spatial and high temporal resolution (1.3×1.3×1.3 mm3, 1 volume/1.25 s), which is allowed by a combination of parallel imaging (GRAPPA 3×2, separate calibration lines), partial Fourier (8/10 in both ky and kz) and view-sharing (A=8-14% and 5 B segments). Thoracic imaging requires larger spatial coverage, and involves strongly anisotropic resolution (1.1×1.1×3 mm3, 1 volume/4.25 s). Due to geometric factors in the coils design, limited parallel imaging (GRAPPA 2×1 or 2×2, 24×24 calibration lines) and view-sharing (A=25% and 4 B segments) are used in par with partial Fourier (8/10 in both ky and kz).

The TWIST sequence uses a division of k-space based on a spiral pattern. First k-space is reordered in the ky-kz plane along a spiral-out trajectory. Second k-space is divided into 2 parts: the central part A and the high frequencies part B. Third the B part is subdivided into $N_b$ portions, such that the first B portion contains the $1^{st}$ line along the spiral trajectory, then the $(N_b+1)^{th}$ line, the $(2*N_b+1)^{th}$, etc. The second B portion contains lines 2, $(N_b+2)$, $(2*N_b+1)$, etc. During the acquisition, the A part is acquired more frequently in order to update the contrast of images governed by low frequencies. And each B portion is acquired in pair with one A. View-sharing is then performed to gather a full k-space for each A part by sharing B segments over time. The view-sharing is preferably performed forward, combining each A-B pair with the missing B portions acquired previously, in order to provide sharp imaging of contrast intake. The resulting imaging has a frame rate equal to the frequency of acquisition of A-B pairs, but the temporal footprint of each image is greatly lengthened.

The alternative approach is to limit the view-sharing to only neighbor B portions. It has the consequence of providing incomplete k-spaces but it greatly reduces sharing over time. The purpose is to minimize the temporal footprint of each reconstructed volume.

The Compressed Sensing image reconstruction method was adapted to a parallel imaging context for evaluation. Because of the reduction of view-sharing, the reconstruction is provided with incomplete k-spaces. However under-sampling is compensated using a priori information in the Compressed Sensing reconstruction framework. The image reconstruction algorithm combines Compressed Sensing (CS) and parallel imaging (PI).

The CS reconstruction algorithm uses the magnitude subtraction of consecutive MRA volumes over time while adding parallel imaging in the reconstruction to improve the reconstruction using spatial information from multi-coil arrays. Parallel imaging was added to the magnitude subtraction CS algorithm using the SPIRiT inter-coils operator S, applied in the image space. The inter-coil relationships in S are assumed to be constant over time:

$$(I_1, I_2) = \mathrm{argmin} \begin{Bmatrix} \|U_1 F(S*I_1) - K_1\|_2^2 + \lambda TV(I_1) + \mu\||I_2| - |I_1|\|_1 \\ \|U_2 F(S*I_2) - K_2\|_2^2 + \lambda TV(I_2) + \mu\||I_2| - |I_1|\|_1 \end{Bmatrix}.$$

SPIRiT operators were estimated from the auto-calibration lines acquired separately at the beginning of the sequence. The reconstruction is actually performed in a slice-wise fashion: the first dimension (kx) is Fourier transformed and the reconstruction of the slices can be parallelized.

Parameters for the minimization were set in order to limit the de-noising during reconstruction so as the resulting images remain true to the original data, and particularly to the initial noise level: $p=0.1$, $\lambda=0.1$ and the thresholds for shrinkage were data-driven using the 90% level of the histogram of each Bregman distance.

For each acquired dataset, two image reconstructions were performed: 1) TWIST reconstruction involving full view-sharing (all 4 to 5 B segments and 1 A) and the CS reconstruction; and 2) CS-TWIST reconstruction involving minimum view-sharing (2 adjacent B segments and 1 A) followed by the magnitude subtraction CS reconstruction.

The same reconstruction algorithm was used in order to discard possible divergence due to the reconstruction itself. The CS reconstruction behaved very similarly to a simple SPIRiT reconstruction (pure parallel imaging) in the TWIST case with low, regular under-sampling.

From these 2 images series, quantitative mean transit time (MTT) maps were computed as:

$$MTT = \frac{\int_t I(T) T dT}{\int_t I(T) dT}$$

MTT maps were masked using a two standard deviation threshold from the temporal maximum intensity projection (tMIP) to facilitate visualization. MTT maps provide comparison for both spatial and temporal resolution between the 2 techniques.

The quality of the images reconstructed from the 2 different methods in comparison of the phantom and the clinical data was evaluated. The TWIST unique distribution of sampling across a spiral-like in ky-kz plane, when not view-shared, resulted in an almost incoherent under-sampling. This feature was very beneficial to the Compressed Sensing reconstructions and allowed for minimal under-sampling artifacts in the eventual reconstructed images.

Temporal blurring was observed with the TWIST view-sharing reconstruction of the phantom. The results with the phantom illustrated the impact of view-sharing reconstruction on the tracking of an injected air bubble along a projection line that reproduced the issue of imaging fast travelling events that occur in relatively small structures. However the reduction of view-sharing using CS reconstruction allowed for the observation of a completely dark contrast, corresponding to the air bubble passage.

Temporal blurring was also observed with view-sharing reconstructions of the bolus intensity enhancement in a typical clinical experiment. The impact was particularly severe in the case of smaller blood vessels (e.g. carotids) which are very sensitive to the sharing of high-frequency information stretched in time.

Reconstruction with a smaller footprint using CS-TWIST (1 old B and 1 new B) provided enhancement in-between. Similar to the phantom experimental results, the CS-TWIST showed higher peak intensity than seen with the view-sharing reconstruction. Smaller arteries are enhanced earlier using CS-TWIST reconstruction compared to the view-shared TWIST reconstruction.

Because of the importance of temporal resolution in an application such carotid TR-CE-MRA, the temporal blurring caused by view-sharing is unacceptable because it can generate bolus dynamic inaccuracies. Furthermore, for time-resolved CE-MRA in the body, such as thoracic time-resolved CE-MRA, the prolonged temporal footprint due to view-sharing also generates a susceptibility of motion events, which may result in spatial blurring of the smaller vessels as well. However, the limitation of the temporal footprint using CS reconstruction guaranties lesser motion corruption in k-space data, which results in the improvement the delineation of the smaller blood vessels. This is of particular interest for the diagnostic of micro-vascular malformations in the chest and the abdomen. Patients often have difficulties holding their breath, which may compromise the diagnostic potential of time-resolved CE-MRA as well as high-resolution CE-MRA.

Accordingly, the complex impact of view-sharing on intensity is a major limitation to the quantification of hemodynamic parameters. Indeed the blurring from view-sharing can be both spatial and temporal, non-uniform, particularly strong along the temporal dimension. Mean Transit Time (MTT) is a significant biomarker for the assessment of hemodynamics using MRI as a non-invasive alternative to current techniques, especially positron emission tomography (PET). However view-sharing stands as a current limitation to the accuracy of TR-CE-MRA. The corruption of biomarkers, such as Mean Transit Time or other parameters derived from a perfusion model cannot be synthesized to a simple bulk shift because of view-sharing, but relates to the size of each vessel relative to the imaging resolution. The CS approach was shown to avoid many of the deficiencies of view-sharing.

Embodiments of the present invention may be described with reference to flowchart illustrations of methods and systems according to embodiments of the invention, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

From the discussion above it will be appreciated that the invention can be embodied in various ways, including the following:

1. A method of contrast enhanced magnetic resonance imaging, the method comprising: (a) acquiring a plurality of magnetic resonance imaging data sets of a subject from a scanner by randomly under-sampling Cartesian k-space; and (b) reconstructing images from the acquired data sets with a split-Bregman minimization of the sum of the L1 norm of the pixel-wise magnitude difference between two successive temporal frames, a fidelity term and a total variation (TV) sparsity term.

2. A method as recited in any previous embodiment, further comprising optimizing weighting parameters by retrospectively under-sampling the k-space and minimizing root mean square error between original k-space images and reconstructed images.

3. A method as recited in any previous embodiment, further comprising normalizing acquired data by maximum image intensity prior to image reconstruction.

4. A method as recited in any previous embodiment, wherein the random under-sampling of Cartesian k-space uses variable density Poisson-disk random patterns.

5. A method as recited in any previous embodiment, further comprising: plotting a sampling trajectory on a ky-kz plane in k-space; and sampling k-space at the beginning of each temporal frame to avoid motion sensitivity and eddy currents that can affect imaging.

6. A method as recited in any previous embodiment, wherein the reconstruction further comprises: minimizing cost function for a volume by dividing a cost function into multiple Bregman distances and updating the distances according to a norm and a threshold.

7. A method as recited in any previous embodiment, further comprising: acquiring dynamic contrast enhanced magnetic resonance imaging under-sampled k-space datasets for a plurality of temporal frames; and reconstructing images from the datasets by solving:

$$(I_1, I_2) = \mathrm{argmin} \begin{cases} \|U_1 F(I_1) - K_1\|_2^2 + \lambda TV(I_1) + \mu \||I_2| e^{i\phi_1} - I_1|_1 \\ \|U_2 F(I_2) - K_2\|_2^2 + \lambda TV(I_2) + \mu |I_2 - |I_1| e^{i\phi_2}|_1 \end{cases};$$

wherein fidelity terms $\|U_1 F(I_1) - K_1\|_2^2$ and $\|U_2 F(I_2) - K_2\|_2^2$ compare the Fourier transform (F) of the estimated images ($I_1$ and $I_2$) to measured samples ($K_1$ and $K_2$) using sampling masks ($U_1$ and $U_2$); wherein the total variation terms $\lambda TV(I_1)$ and $\lambda TV(I_2)$ are the L1-norm of the discrete gradients of $I_1$ and $I_2$; and wherein the $\||I_2| e^{i\phi_1} - I_1|_1$ and $|I_2 - |I_1| e^{i\phi_2}|_1$ terms are the L1 norm of the pixel-wise magnitude subtracted image: $\||I_2| - |I_1|\|_1 = \||I_2| e^{i\phi_1} - I_1|_1 = |I_2 - |I_1| e^{i\phi_2}|_1$.

8. A method of contrast enhanced magnetic resonance angiography, the method comprising: (a) acquiring a first series of magnetic resonance imaging data sets of a subject from a scanner without contrast by randomly under-sampling Cartesian k-space; (b) acquiring a second series of magnetic resonance imaging data sets of a subject from a scanner in the presence of contrast by randomly under-sampling Cartesian k-space; and (c) reconstructing images from the acquired data sets with a split-Bregman minimization of the sum of the L1 norm of the pixel-wise magnitude difference between two successive temporal frames, a fidelity term and a total variation (TV) sparsity term.

9. A method as recited in any previous embodiment, further comprising performing a preliminary low definition reconstruction to assess timing before performing a high definition reconstruction to produce final magnetic resonance images.

10. A method as recited in any previous embodiment, wherein the first series and the second series of magnetic resonance data sets are acquired using an acquisition technique selected from the group consisting of time-resolved imaging with stochastic trajectories (TWIST), time-resolved imaging of contrast kinetics (TRICKS) and time resolved angiography using keyhole (TRAK).

11. A method as recited in any previous embodiment, further comprising optimizing weighting parameters by retrospectively under-sampling the k-space and minimizing root mean square error between original k-space images and reconstructed images.

12. A method as recited in any previous embodiment, further comprising normalizing acquired data by maximum image intensity prior to image reconstruction.

13. A method as recited in any previous embodiment, wherein the random under-sampling of Cartesian k-space uses variable density Poisson-disk random patterns.

14. A method as recited in any previous embodiment, wherein the reconstruction further comprises minimizing cost function for a volume by dividing a cost function into multiple Bregman distances and updating the distances according to a norm and a threshold.

15. A method as recited in any previous embodiment, wherein the reconstruction from said datasets comprises solving:

$$(I_1, I_2) = \mathrm{argmin} \left\{ \begin{array}{l} \|U_1 F(I_1) - K_1\|_2^2 + \lambda TV(I_1) + \mu \| |I_2| e^{i\phi_1} - I_1 \|_1 \\ \|U_2 F(I_2) - K_2\|_2^2 + \lambda TV(I_2) + \mu \| I_2 - |I_1| e^{i\phi_2} \|_1 \end{array} \right\},$$

wherein fidelity terms $\|U_1 F(I_1)-K_1\|_2^2$ and $\|U_2 F(I_2)-K_2\|_2^2$ compare the Fourier transform (F) of the estimated images ($I_1$ and $I_2$) to measured samples ($K_1$ and $K_2$) using sampling masks ($U_1$ and $U_2$); wherein the total variation terms $\lambda TV(I_1)$ and $\lambda TV(I_2)$ are the L1-norm of the discrete gradients of $I_1$ and $I_2$; and wherein the $\||I_2|e^{i\varphi_1}-I_1\|_1$ and $\|I_2-|I_1|e^{i\varphi_2}\|_1$ terms are the L1 norm of the pixel-wise magnitude subtracted image: $\||I_2|-|I_1|\|_1=\||I_2|e^{i\varphi_1}-I_1\|_1=\|I_2-|I_1|e^{i\varphi_2}\|_1$.

16. A method of contrast enhanced magnetic resonance angiography, the method comprising: (a) acquiring a first series of magnetic resonance imaging data sets of a subject from a scanner without contrast by randomly under-sampling Cartesian k-space using variable density Poisson-disk random patterns; (b) acquiring a second series of magnetic resonance imaging data sets of a subject from a scanner in the presence of contrast by randomly under-sampling Cartesian k-space using variable density Poisson-disk random patterns; and (c) reconstructing images from the acquired data sets by solving:

$$(I_1, I_2) = \mathrm{argmin} \left\{ \begin{array}{l} \|U_1 F(I_1) - K_1\|_2^2 + \lambda TV(I_1) + \mu \| |I_2| e^{i\phi_1} - I_1 \|_1 \\ \|U_2 F(I_2) - K_2\|_2^2 + \lambda TV(I_2) + \mu \| I_2 - |I_1| e^{i\phi_2} \|_1 \end{array} \right\};$$

wherein fidelity terms $\|U_1 F(I_1)-K_1\|_2^2$ and $\|U_2 F(I_2)-K_2\|_2^2$ compare the Fourier transform (F) of the estimated images ($I_1$ and $I_2$) to measured samples ($K_1$ and $K_2$) using sampling masks ($U_1$ and $U_2$); wherein the total variation terms $\lambda TV(I_1)$ and $\lambda TV(I_2)$ are the L1-norm of the discrete gradients of $I_1$ and $I_2$; and wherein the $\||I_2|e^{i\varphi_1}-I_1\|_1$ and $\|I_2-|I_1|e^{i\varphi_2}\|_1$ terms are the L1 norm of the pixel-wise magnitude subtracted image: $\||I_2|-|I_1|\|_1=\||I_2|e^{i\varphi_1}-I_1\|_1=\|I_2-|I_1|e^{i\varphi_2}\|_1$.

17. A method as recited in any previous embodiment, further comprising optimizing weighting parameters by retrospectively under-sampling the k-space and minimizing root mean square error between original k-space images and reconstructed images.

18. A method as recited in any previous embodiment, further comprising normalizing acquired data by maximum image intensity prior to image reconstruction.

19. A method as recited in any previous embodiment, further comprising: plotting a sampling trajectory on a ky-kz plane in k-space; and sampling k-space at the beginning of each temporal frame to motion sensitivity and eddy currents that can affect imaging.

20. A method as recited in any previous embodiment, wherein the sampling trajectory is a spiral pattern centered at the center of k-space.

21. A method as recited in any previous embodiment, wherein the image reconstruction from the acquired data sets is performed by solving:

$$(I_1, I_2) = \mathrm{argmin} \left\{ \begin{array}{l} \|U_1 F(S*I_1) - K_1\|_2^2 + \lambda TV(I_1) + \mu \| |I_2| - |I_1| \|_1 \\ \|U_2 F(S*I_2) - K_2\|_2^2 + \lambda TV(I_2) + \mu \| |I_2| - |I_1| \|_1 \end{array} \right\}$$

22. A method as recited in any previous embodiment, wherein magnetic resonance data sets are acquired using an acquisition technique selected from the group consisting of time-resolved imaging with stochastic trajectories (TWIST), time-resolved imaging of contrast kinetics (TRICKS) and time resolved angiography using keyhole (TRAK); and image reconstruction is performed by solving:

$$(I_1, I_2) = \mathrm{argmin} \left\{ \begin{array}{l} \|U_1 F(S*I_1) - K_1\|_2^2 + \lambda TV(I_1) + \mu \| |I_2| - |I_1| \|_1 \\ \|U_2 F(S*I_2) - K_2\|_2^2 + \lambda TV(I_2) + \mu \| |I_2| - |I_1| \|_1 \end{array} \right\}$$

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method of contrast enhanced magnetic resonance angiography, the method comprising:
    (a) acquiring a first series of magnetic resonance imaging data sets of a subject from a scanner without contrast by randomly under-sampling Cartesian k-space;
    (b) acquiring a second series of magnetic resonance imaging data sets of a subject from a scanner in the presence of contrast by randomly under-sampling Cartesian k-space; and (c) reconstructing images from the acquired data sets with a split-Bregman minimization of the sum of the L1 norm of the pixel-wise magnitude difference between two successive temporal frames, a fidelity term and a total variation (TV) sparsity term.

2. A method as recited in claim 1, further comprising performing a preliminary low definition reconstruction to assess timing before performing a high definition reconstruction to produce final magnetic resonance images.

3. A method as recited in claim 2, wherein said first series and said second series of magnetic resonance data sets are acquired using an acquisition technique selected from the group consisting of time-resolved imaging with stochastic trajectories (TWIST), time-resolved imaging of contrast kinetics (TRICKS) and time resolved angiography using keyhole (TRAK).

4. A method as recited in claim 1, further comprising optimizing weighting parameters by retrospectively under-sampling the k-space and minimizing root mean square error between original k-space images and reconstructed images.

5. A method as recited in claim 4, further comprising normalizing acquired data by maximum image intensity prior to image reconstruction.

6. A method as recited in claim 1, wherein said random under-sampling of Cartesian k-space uses variable density Poisson-disk random patterns.

7. A method as recited in claim 1, wherein said reconstruction further comprises minimizing cost function for a volume by dividing a cost function into multiple Bregman distances and updating the distances according to a norm and a threshold.

8. A method as recited in claim 1, wherein said reconstruction from said datasets comprises solving:

$$(I_1, I_2) = \operatorname{argmin}\left\{\begin{array}{l}\|U_1 F(I_1) - K_1\|_2^2 + \lambda TV(I_1) + \mu \||I_2|e^{i\phi_1} - I_1|_1 \\ \|U_2 F(I_2) - K_2\|_2^2 + \lambda TV(I_2) + \mu |I_2 - |I_1|e^{i\phi_2}|_1\end{array}\right\}$$

wherein fidelity terms $\|U_1F(I_1)-K_1\|_2^2$ and $\|U_2F(I_2)-K_2\|_2^2$ compare the Fourier transform (F) of the estimated images ($I_1$ and $I_2$) to measured samples ($K_1$ and $K_2$) using sampling masks ($U_1$ and $U_2$);

wherein the total variation terms $\lambda TV(I_1)$ and $\lambda TV(I_2)$ are the L1-norm of the discrete gradients of $I_1$ and $I_2$; and wherein the $\||I_2|e^{i\phi_1}-I_1|_1$ and $|I_2-|I_1|e^{i\phi_2}|_1$ terms are the L1 norm of the pixel-wise magnitude subtracted image: $\||I_2|-|I_1|\|_1=\||I_2|e^{i\phi_1}-I_1|_1=|I_2-|I_1|e^{i\phi_2}|_1$.

9. A method of contrast enhanced magnetic resonance angiography, the method comprising:

(a) acquiring a first series of magnetic resonance imaging data sets of a subject from a scanner without contrast by randomly under-sampling Cartesian k-space using variable density Poisson-disk random patterns;

(b) acquiring a second series of magnetic resonance imaging data sets of a subject from a scanner in the presence of contrast by randomly under-sampling Cartesian k-space using variable density Poisson-disk random patterns; and (c) reconstructing images from the acquired data sets by solving:

$$(I_1, I_2) = \operatorname{argmin}\left\{\begin{array}{l}\|U_1 F(I_1) - K_1\|_2^2 + \lambda TV(I_1) + \mu \||I_2|e^{i\phi_1} - I_1|_1 \\ \|U_2 F(I_2) - K_2\|_2^2 + \lambda TV(I_2) + \mu |I_2 - |I_1|e^{i\phi_2}|_1\end{array}\right\}$$

wherein fidelity terms $\|U_1F(I_1)-K_1\|_2^2$ and $\|U_2F(I_2)-K_2\|_2^2$ compare the Fourier transform (F) of the estimated images ($I_1$ and $I_2$) to measured samples ($K_1$ and $K_2$) using sampling masks ($U_1$ and $U_2$);

wherein the total variation terms $\lambda TV(I_1)$ and $\lambda TV(12)$ are the L1-norm of the discrete gradients of $I_1$ and $I_2$; and wherein the $\||I_2|e^{i\phi_1}-I_1|_1$ and $|I_2-|I_1|e^{i\phi_2}|_1$ terms are the L1 norm of the pixel-wise magnitude subtracted image: $\||I_2|-|I_1|\|_1=\||I_2|e^{i\phi_1}-I_1|_1=|I_2-|I_1|e^{i\phi_2}|_1$.

10. A method as recited in claim 9, further comprising optimizing weighting parameters by retrospectively under-sampling the k-space and minimizing root mean square error between original k-space images and reconstructed images.

11. A method as recited in claim 10, further comprising normalizing acquired data by maximum image intensity prior to image reconstruction.

12. A method as recited in claim 10, further comprising: plotting a sampling trajectory on a ky-kz plane in k-space; and sampling k-space at the beginning of each temporal frame to motion sensitivity and eddy currents that can affect imaging.

13. A method as recited in claim 12, wherein said sampling trajectory is a spiral pattern centered at the center of k-space.

* * * * *

UNITED STATES PATENT AND TRADEMARK OFFICE
CERTIFICATE OF CORRECTION

| | | |
|---|---|---|
| PATENT NO. | : 9,983,285 B2 | Page 1 of 6 |
| APPLICATION NO. | : 14/709089 | |
| DATED | : May 29, 2018 | |
| INVENTOR(S) | : Peng Hu et al. | |

It is certified that error appears in the above-identified patent and that said Letters Patent is hereby corrected as shown below:

In the Specification

Column 3, Line 25, "$I_1 = \text{argmin} \| U_1 F(I_1) - K_1 \|_2^2 + \lambda TV(I_1) + \mu \| I_2 | e^{i\varphi 1} - I_1 |_1,$"

should be -- $I_1 = \text{argmin} \| U_1 F(I_1) - K_1 \|_2^2 + \lambda TV(I_1) + \mu \| I_2 | e^{i\phi_1} - I_1 \|_1$ --.

Column 3, Line 28, "$I_2 = \text{argmin} \| U_2 F(I_2) - K_2 \|_2^2 + \lambda TV(I_2) + \mu | I_2 - | I_1 | e^{i\varphi 2} |_1,$"

should be -- $I_2 = \text{argmin} \| U_2 F(I_2) - K_2 \|_2^2 + \lambda TV(I_2) + \mu | I_2 - | I_1 | e^{i\phi_2} |_1$ --.

Column 3, Lines 32-33, "$\| I_2 | - | I_1 \|_1 = \| I_2 | e^{i\varphi 1} - I_1 |_1 = | I_2 - | I_1 | e^{i\varphi 2} |_1,$"

should be -- $\| | I_2 | - | I_1 | \|_1 = \| I_2 | e^{i\phi_1} - I_1 \|_1 = | I_2 - | I_1 | e^{i\phi_2} |_1$ --.

Column 6, Line 28, "$I_1 : \| | I_2 | - | I_1 | \|_1 = \| I_2 | e^{i\varphi 1} - I_1 \|_1$"

should be -- $I_1 : \| | I_2 | - | I_1 | \|_1 = \| I_2 | e^{i\phi_1} - I_1 \|_1$ --.

Signed and Sealed this
Thirtieth Day of April, 2019

Andrei Iancu
*Director of the United States Patent and Trademark Office*

CERTIFICATE OF CORRECTION (continued)
U.S. Pat. No. 9,983,285 B2

Column 6, Line 30, " $\left\| |I_2| - |I_1| \right\|_1 = \left| I_2 - |I_1| e^{e\phi_2} \right|_1$ "

should be -- $\left\| |I_2| - |I_1| \right\|_1 = \left| I_2 - |I_1| e^{e\phi_2} \right|_1$ --.

Column 6, Line 36,

" $(I_1, I_2) = \text{argmin} \begin{Bmatrix} \| U_1 F(I_1) - K_1 \|_2^2 + \lambda TV(I_1) + \mu \left\| |I_2| e^{i\phi_1} - I_1 \right\|_1 \\ \| U_2 F(I_2) - K_2 \|_2^2 + \lambda TV(I_2) + \mu \left| I_2 - |I_1| e^{i\phi_2} \right|_1 \end{Bmatrix}$ "

should be -- $(I_1, I_2) = \text{argmin} \begin{Bmatrix} \| U_1 F(I_1) - K_1 \|_2^2 + \lambda TV(I_1) + \mu \left\| |I_2| e^{i\phi_1} - I_1 \right\|_1 \\ \| U_2 F(I_2) - K_2 \|_2^2 + \lambda TV(I_2) + \mu \left| I_2 - |I_1| e^{i\phi_2} \right|_1 \end{Bmatrix}$ --.

Column 13, Line 40,

" $(I_1, I_2) = \text{argmin} \begin{Bmatrix} \| U_1 F(S * I_1) - K_1 \|_2^2 + \lambda TV(I_1) + \mu \left\| |I_2| - |I_1| \right\|_1 \\ \| U_2 F(S * I_2) - K_2 \|_2^2 + \lambda TV(I_2) + \mu \left\| |I_2| - |I_1| \right\|_1 \end{Bmatrix}$ "

should be -- $(I_1, I_2) = \text{argmin} \begin{Bmatrix} \| U_1 F(S * I_1) - K_1 \|_2^2 + \lambda TV(I_1) + \mu \left\| |I_2| - |I_1| \right\|_1 \\ \| U_2 F(S * I_2) - K_2 \|_2^2 + \lambda TV(I_2) + \mu \left\| |I_2| - |I_1| \right\|_1 \end{Bmatrix}$ --.

Column 16, Line 36,

" $(I_1, I_1) = \text{argmin} \begin{Bmatrix} \| U_1 F(I_1) - K_1 \|_2^2 + \lambda TV(I_1) + \mu \left\| |I_2| e^{i\phi_1} - I_1 \right\|_1 \\ \| U_2 F(I_2) - K_2 \|_2^2 + \lambda TV(I_2) + \mu \left| I_2 - |I_1| e^{i\phi_2} \right|_1 \end{Bmatrix}$ "

should be -- $(I_1, I_1) = \text{argmin} \begin{Bmatrix} \| U_1 F(I_1) - K_1 \|_2^2 + \lambda TV(I_1) + \mu \left\| |I_2| e^{i\phi_1} - I_1 \right\|_1 \\ \| U_2 F(I_2) - K_2 \|_2^2 + \lambda TV(I_2) + \mu \left| I_2 - |I_1| e^{i\phi_2} \right|_1 \end{Bmatrix}$ --.

Column 16, Line 43, " $\left\| |I_2| e^{i\phi_1} - I_1 \right\|_1$ and $\left| I_2 - I_1 | e^{i\phi_2} \right|_1$ "

CERTIFICATE OF CORRECTION (continued)
U.S. Pat. No. 9,983,285 B2 should be -- $\left\| |I_2| e^{i\phi_1} - I_1 \right\|_1$ and $\left| I_2 - |I_1| e^{i\phi_2} \right|_1$ --.

Column 16, Line 45, " $\left\| |I_2| - |I_1| \right\|_1 = \left\| |I_2| e^{i\varphi_1} - I_1 \right\|_1 = \left| I_2 - |I_1| e^{i\varphi_2} \right|_1$ "

should be -- $\left\| |I_2| - |I_1| \right\|_1 = \left\| |I_2| e^{i\phi_1} - I_1 \right\|_1 = \left| I_2 - |I_1| e^{i\phi_2} \right|_1$ --.

Column 17, Line 26,

"
$$(I_1, I_2) = \text{argmin} \begin{Bmatrix} \|U_1 F(I_1) - K_1\|_2^2 + \lambda TV(I_1) + \mu \||I_2| e^{i\phi_1} - I_1|_1 \\ \|U_2 F(I_2) - K_2\|_2^2 + \lambda TV(I_2) + \mu |I_2 - |I_1| e^{i\phi_2}|_1 \end{Bmatrix}$$
"

should be --
$$(I_1, I_2) = \text{argmin} \begin{Bmatrix} \|U_1 F(I_1) - K_1\|_2^2 + \lambda TV(I_1) + \mu \left\| |I_2| e^{i\phi_1} - I_1 \right\|_1 \\ \|U_2 F(I_2) - K_2\|_2^2 + \lambda TV(I_2) + \mu \left| I_2 - |I_1| e^{i\phi_2} \right|_1 \end{Bmatrix}$$
--.

Column 17, Line 34, " $\left\| |I_2| e^{i\varphi_1} - I_1 \right\|_1$ and $\left| I_2 - |I_1| e^{i\varphi_2} \right|_1$ "

should be -- $\left\| |I_2| e^{i\phi_1} - I_1 \right\|_1$ and $\left| I_2 - |I_1| e^{i\phi_2} \right|_1$ --.

Column 17, Line 36, " $\left\| |I_2| - |I_1| \right\|_1 = \left\| |I_2| e^{i\varphi_1} - I_1 \right\|_1 = |I_2 - |I_1| e^{i\varphi_2}|_1$ "

should be -- $\left\| |I_2| - I_1 \right\|_1 = \left\| |I_2| e^{i\phi_1} - I_1 \right\|_1 = \left| I_2 - |I_1| e^{i\phi_2} \right|_1$ --.

Column 17, Line 51,

"
$$(I_1, I_2) = \text{argmin} \begin{Bmatrix} \|U_1 F(I_1) - K_1\|_2^2 + \lambda TV(I_1) + \mu \||I_2| e^{i\phi_1} - I_1|_1 \\ \|U_2 F(I_2) - K_2\|_2^2 + \lambda TV(I_2) + \mu |I_2 - |I_1| e^{i\phi_2}|_1 \end{Bmatrix}$$
"

CERTIFICATE OF CORRECTION (continued)
U.S. Pat. No. 9,983,285 B2

$$(I_1, I_2) = \text{argmin} \begin{Bmatrix} \|U_1F(I_1) - K_1\|_2^2 + \lambda TV(I_1) + \mu \left\| |I_2| e^{i\phi_1} - I_1 \right\|_1 \\ \|U_2F(I_2) - K_2\|_2^2 + \lambda TV(I_2) + \mu \left| I_2 - |I_1| e^{i\phi_2} \right|_1 \end{Bmatrix}$$

should be -- --.

Column 17, Line 60, " $\left\| |I_2| e^{i\phi_1} - I_1 \right\|_1$ and $\left| I_2 - |I_1| e^{i\phi_2} \right|_1$ "

should be -- $\left\| |I_2| e^{i\phi_1} - I_1 \right\|_1$ and $\left| I_2 - |I_1| e^{i\phi_2} \right|_1$ --.

Column 17, Line 62, " $\left\| |I_2| - |I_1| \right\|_1 = \left\| |I_2| e^{i\phi_1} - I_1 \right\|_1 = \left| I_2 - |I_1| e^{i\phi_2} \right|_1$ "

should be -- $\left\| |I_2| - I_1 \right\|_1 = \left\| |I_2| e^{i\phi_1} - I_1 \right\|_1 = \left| I_2 - |I_1| e^{i\phi_2} \right|_1$ --.

Column 18, Line 18,

" $(I_1, I_2) = \text{argmin} \begin{Bmatrix} \| U_1F(S * I_1) - K_1 \|_2^2 + \lambda TV(I_1) + \mu \| |I_2| - |I_1| \|_1 \\ \| U_2F(S * I_2) - K_2 \|_2^2 + \lambda TV(I_2) + \mu \| |I_2| - |I_1| \|_1 \end{Bmatrix}$ "

should be -- $(I_1, I_2) = \text{argmin} \begin{Bmatrix} \| U_1F(S* I_1) - K_1 \|_2^2 + \lambda TV(I_1) + \mu \| |I_2| - |I_1| \|_1 \\ \| U_2F(S* I_2) - K_2 \|_2^2 + \lambda TV(I_2) + \mu \| |I_2| - |I_1| \|_1 \end{Bmatrix}$ --.

Column 18, Line 31,

" $(I_1, I_2) = \text{argmin} \begin{Bmatrix} \| U_1F(S * I_1) - K_1 \|_2^2 + \lambda TV(I_1) + \mu \| |I_2| - |I_1| \|_1 \\ \| U_2F(S * I_2) - K_2 \|_2^2 + \lambda TV(I_2) + \mu \| |I_2| - |I_1| \|_1 \end{Bmatrix}$ "

should be -- $(I_1, I_2) = \text{argmin} \begin{Bmatrix} \| U_1F(S* I_1) - K_1 \|_2^2 + \lambda TV(I_1) + \mu \| |I_2| - |I_1| \|_1 \\ \| U_2F(S* I_2) - K_2 \|_2^2 + \lambda TV(I_2) + \mu \| |I_2| - |I_1| \|_1 \end{Bmatrix}$ --.

In the Claims

Column 19, Claim 8, Line 37,

"$$(I_1, I_2) = \text{argmin} \begin{Bmatrix} \|U_1 F(I_1) - K_1\|_2^2 + \lambda TV(I_1) + \mu \| |I_2| e^{i\phi_1} - I_1 |_1 \\ \|U_2 F(I_2) - K_2\|_2^2 + \lambda TV(I_2) + \mu | I_2 - |I_1| e^{i\phi_2} |_1 \end{Bmatrix}$$"

should be --

$$(I_1, I_2) = \text{argmin} \begin{Bmatrix} \|U_1 F(I_1) - K_1\|_2^2 + \lambda TV(I_1) + \mu \left\| |I_2| e^{i\phi_1} - I_1 \right\|_1 \\ \|U_2 F(I_2) - K_2\|_2^2 + \lambda TV(I_2) + \mu \left| I_2 - |I_1| e^{i\phi_2} \right|_1 \end{Bmatrix}$$ --.

Column 19, Claim 8, Line 46, "$\| |I_2| e^{i\phi_1} - I_1 |_1$ and $| I_2 - |I_1| e^{i\phi_2} |_1$"

should be -- $\left\| |I_2| e^{i\phi_1} - I_1 \right\|_1$ and $\left| I_2 - |I_1| e^{i\phi_2} \right|_1$ --.

Column 19, Claim 8, Line 48, "$\| |I_2| - |I_1| \|_1 = \| I_2 e^{i\phi_1} - I_1 |_1 = | I_2 - |I_1| e^{i\phi_2} |_1$"

should be -- $\| |I_2| - I_1 \|_1 = \| I_2 e^{i\phi_1} - I_1 \|_1 = | I_2 - |I_1| e^{i\phi_2} |_1$ --.

Column 20, Claim 9, Line 18,

"$$(I_1, I_2) = \text{argmin} \begin{Bmatrix} \|U_1 F(I_1) - K_1\|_2^2 + \lambda TV(I_1) + \mu \| |I_2| e^{i\phi_1} - I_1 |_1 \\ \|U_2 F(I_2) - K_2\|_2^2 + \lambda TV(I_2) + \mu | I_2 - |I_1| e^{i\phi_2} |_1 \end{Bmatrix}$$"

should be --

$$(I_1, I_2) = \text{argmin} \begin{Bmatrix} \|U_1 F(I_1) - K_1\|_2^2 + \lambda TV(I_1) + \mu \left\| |I_2| e^{i\phi_1} - I_1 \right\|_1 \\ \|U_2 F(I_2) - K_2\|_2^2 + \lambda TV(I_2) + \mu \left| I_2 - |I_1| e^{i\phi_2} \right|_1 \end{Bmatrix}$$ --.

Column 20, Claim 9, Line 29, "$\| |I_2| e^{i\phi_1} - I_1 |_1$ and $| I_2 - |I_1| e^{i\phi_2} |_1$"

CERTIFICATE OF CORRECTION (continued)
U.S. Pat. No. 9,983,285 B2 should be -- $\left|\,|I_2|\,e^{i\phi_1}-I_1\right|_1$ and $\left|I_2-|I_1|\,e^{i\phi_2}\right|_1$ --.

Column 20, Claim 9, Line 31, "$\left\|\,|I_2|-|I_1|\,\right\|_1 = \left\|\,|I_2|\,e^{i\phi_1}-I_1\right|_1 = |I_2-|I_1|\,e^{i\phi_2}|_1$,"

should be -- $\left\|\,|I_2|-I_1\,\right\|_1 = \left\|\,|I_2|\,e^{i\phi_1}-I_1\right|_1 = \left|I_2-|I_1|\,e^{i\phi_2}\right|_1$ --.